(12) United States Patent
Joyce et al.

(10) Patent No.: US 6,309,556 B1
(45) Date of Patent: *Oct. 30, 2001

(54) METHOD OF MANUFACTURING ENHANCED FINISH SPUTTERING TARGETS

(75) Inventors: James Elliot Joyce, Bedford; Thomas John Hunt, Peekskill; Paul Sandford Gilman, Suffenn, all of NY (US)

(73) Assignee: Praxair S.T. Technology, Inc., North Haven, CT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,600

(22) Filed: Sep. 3, 1998

(51) Int. Cl.⁷ ..................................... C23C 14/14
(52) U.S. Cl. .................. 216/100; 428/612; 428/687; 428/141; 204/298.12; 204/298.13
(58) Field of Search ..................................... 428/141, 612, 428/687; 204/298.12, 298.13; 216/100

(56) References Cited

U.S. PATENT DOCUMENTS

| | | | |
|---|---|---|---|
| 2,981,609 | * 4/1961 | Acker et al. | 252/79.3 |
| 3,745,079 | * 7/1973 | Cowles et al. | 156/18 |
| 3,788,914 | * 1/1974 | Gumbelevicius | 156/18 |
| 3,844,859 | * 10/1974 | Roni | 156/18 |
| 4,116,755 | * 9/1978 | Coggins et al. | 156/659 |
| 4,233,108 | * 11/1980 | Tamura et al. | 156/639 |
| 4,900,398 | * 2/1990 | Chen | 156/664 |
| 5,282,943 | * 2/1994 | Lannutti et al. | 204/192.12 |
| 5,630,918 | * 5/1997 | Takahara et al. | 204/298.13 |
| 5,705,052 | * 1/1998 | Hinson | 216/95 |

* cited by examiner

*Primary Examiner*—William P. Watkins, III
(74) *Attorney, Agent, or Firm*—Blake T. Biederman

(57) ABSTRACT

A method is provided for achieving an enhanced finish on a sputter target surface that results in good film uniformity, low particle counts, and little to no burn-in time. The method involves chemically etching the surface of the sputter target by immersing the surface one or more times in an etching solution, with intermediate rinsing steps. The result is a surface substantially free of mechanical deformation that exhibits a surface similar to a sputtered target with a surface roughness of 10–30 μin.

5 Claims, No Drawings

METHOD OF MANUFACTURING ENHANCED FINISH SPUTTERING TARGETS

FIELD OF THE INVENTION

This invention relates to a process for manufacturing sputtering targets with an enhanced finish, and more particularly to a process for chemically etching the surface of sputter targets to achieve an enhanced finish.

BACKGROUND OF THE INVENTION

In the manufacture of sputtering targets used in the semi-conductor industry, it is desirable to produce a target with a sputter surface that will provide film uniformity and minimal particle generation during sputtering onto a semi-conductor wafer. The typical manufacturing processes for sputter targets result in targets with surface defects. Additionally, the materials comprising the sputter targets, such as titanium, aluminum, tantalum, nickel, chromium, cobalt and alloys thereof, have inherently problematic characteristics (i.e., particle size and uniformity and burn-in time requirements) that are a result of the machining process. These inherent defects and characteristics may have an adverse effect on the end user of the sputter target product.

Among the undesirable effects of sputter target manufacture is the lengthy burn-in time for a new sputter target at the customer site. Typically, sputter targets, such as titanium targets, exhibit poor film uniformity and high particle counts during the early stages of target use. As a result, a burn-in cycle, which eliminates the surface defects of the target, must be performed for as long as 30 kWh before the target surface will produce high quality thin film wafers. It is not uncommon for a standard target to go through about 50 wafers during the burn-in cycle before it produces high quality wafers, which is equivalent to about 6.7 kWh. Deposition without this burn-in cycle would result in a relatively high reject rate of poor quality wafers. Thus, the burn-in cycle is required to achieve a sputter surface that will provide the desired film uniformity and particle generation, but it requires a customer to waste valuable processing time and materials. By way of example, for titanium targets, 0.75–1.0% film uniformity is desirable, and 10 particles or less generated per 8 inch wafer is desired.

Various attempts have been made to reduce, eliminate or control the inherently undesirable characteristics resulting from the manufacturing process for sputter targets. For example, grinding, lapping, fine machining, lathes, and hand polishing have been used to remove the surface material of the target. These methods of material removal are time consuming, labor intensive, costly, dirty and provide inconsistent results. While polishing to a mirror finish may provide a good surface finish, it requires extensive preparation and time, usually 20–60 hours, which is unsuitable for a production environment, and there is no guarantee the same result may be obtained consistently for subsequent targets. Furthermore, sputter targets of marginal acceptability due to defects from unaccountable variances in manufacturing cannot be salvaged by the above techniques.

There is thus a need to provide a method for manufacturing sputter targets that provides a consistent finish with low particle counts and minimal surface defects, thereby reducing or eliminating burn-in time prior to use.

SUMMARY OF THE INVENTION

The present invention provides a method for achieving a sputter target with a surface roughness of about 10–30 μin., good film uniformity and low particle counts during initial use, thus significantly reducing burn-in time requirements. The sputter target surface is achieved by chemically etching the surface prior to use. Advantageously, the surface is etched with a first acid solution, rinsed with water, etched in a second acid solution, rinsed with water, rinsed with an alcohol solution, and dried. Although acids are the preferred etchants, other basic chemicals may be used as the etchant for the present invention. The acids or other etching chemicals used in the present invention are advantageously selected from the following: hydrofluoric acid, nitric acid, phosphoric acid, sulfuric acid, hydrochloric acid, acetic acid, lactic acid, ammonium hydroxide, chromic oxide, hydrogen peroxide, potassium ferricyanide and sodium hydroxide. The first and second etching solutions advantageously contain about 1–10% by volume and about 20–60% by volume etchant, respectively. More advantageously, the second solution contains about 1–10% by volume of a first etchant and about 20–50% by volume of a second etchant. The etching is advantageously performed for 1–15 minutes with each solution, and more advantageously, the etching is performed while the solution is agitated, either intermittently or constantly.

In one embodiment of the present invention, a method is provided for finishing the surface of a titanium sputter target. To this end, the surface is etched with a solution of hydrofluoric acid, rinsed with water, etched with a solution of hydrofluoric acid and nitric acid, rinsed with water, rinsed with an alcohol solution, and dried. In a preferred method, the titanium sputter target surface is advantageously etched first with a 1–8% by volume hydrofluoric acid solution for about 1–10 minutes, and second (after rinsing) is etched with a 1–6% by volume hydrofluoric acid/25–45% by volume nitric acid solution for about 2–10 minutes.

These and other objects and advantages of the present invention shall become more apparent from the accompanying description thereof

DETAILED DESCRIPTION

The sputter targets suitable for finishing by the present invention may be targets of any metal, alloy or composition that are suitable for use as a sputter target, such as titanium, aluminum, tantalum, nickel, chromium or cobalt targets or alloys thereof. Especially suitable for the present invention are targets made from HCP (hexagonal close packed) metals.

After manufacture, a sputter target surface is initially finished by abrading and polishing on a lathe, grinding, lapping or by other similar techniques, all of which are well known in the art. Finishing on a lathe is preferred. The initial finishing step is performed until a surface roughness ($R_a$ arithmetic average roughness) of less than 25 μin. is achieved and preferably less than about 10 μin. Thereafter, the sputter target is finished to a $R_a$ of about 10–30 μin. by the chemical etching technique of the present invention. In the first step of the present invention, the surface of the target is immersed in a first etching solution, such as an acid and water solution. The etchants useful in the present invention include, but in no way are limited to: hydrofluoric acid, nitric acid, phosphoric acid, sulfuric acid, hydrochloric acid, acetic acid, lactic acid, ammonium hydroxide, chromic oxide, hydrogen peroxide, potassium ferricyanide and sodium hydroxide. The water may be regular or deionized water. The first etching solution preferably contains about 10% by volume etchant (e.g. acid) or less, and preferably about 1–10% by volume, with the balance being water. One skilled in the art will appreciate that the particular etchant and the solution concentration may be modified to provide optimum results for the specific target material. For titanium targets, the etchant is preferably hydrofluoric acid in an amount of about 1–8% by volume, and more preferably about 2.5% by volume. It may also be advantageous in the present invention to agitate the solution during etching. This agitation may be intermittent or constant, and may be effected by any means known to one skilled in the art. There may also exist some inherent agitation in the solution due to percolation or entrapped air bubbles.

In step two of the present invention, the surface of the target is rinsed with water to remove the etching solution from step one. As a general precaution, the water may be deionized water. This rinsing step preferably occurs immediately after removal of the surface from the first etching solution and continues until all etchant is removed from the surface to prevent discoloration of the target surface.

In step three of the present invention, the surface of the target is immersed in a second etching solution, such as an acid and water solution. The etchants useful for this step are the same as those described for the first etching solution, but are in no way limited thereto. The water may be regular or deionized water. The second etching solution preferably contains about 60% by volume etchant (e.g. acid) or less, and preferably about 20–60% by volume, with the balance being water. The etchant for the second solution is preferably comprised of two or more acids, depending on the target material. One skilled in the art will appreciate that the particular etchant(s) and the solution concentrations may be modified to provide optimum results for the specific target material. For example, for titanium targets, the etchant is preferably hydrofluoric acid in amount of about 1–6% and nitric acid in an amount of about 25–45%, and more preferably about 3.5% hydrofluoric acid and 35% nitric acid. For aluminum or chromium targets, the etchant may advantageously include hydrochloric acid in addition to hydrofluoric and nitric acids. For tantalum targets, the etchant may advantageously include sulfuric acid in addition to hydrofluoric and nitric acids. It may also be advantageous in the present invention to agitate the solution during etching. Agitation in this etching step may prevent acid streaks on the surface of the target due to an uneven mixture flowing on the surface. This agitation may be intermittent or constant, and may be effected by any means known to one skilled in the art. For example, lifting up and tilting the solution container every 30 seconds has proven useful.

In step four of the present invention, the surface of the target is rinsed with water to remove the etching solution from step three. As a general precaution, the water may be deionized water. This rinsing step preferably occurs immediately after removal of the surface from the second etching solution and continues until all etchant is removed from the surface to prevent discoloration of the target surface.

In step five of the present invention, the surface of the target is rinsed with a solution of alcohol and water. The alcohol solution preferably contains about 20–80% by volume alcohol, and more preferably about 50% by volume alcohol. Too little or too much alcohol in the solution may cause water staining on the target surface. As a general precaution, the water may be deionized water.

In step six of the present invention, the surface of the target is dried. This is preferably achieved by a forced flow of dry nitrogen, dry argon, or clean, dry, compressed air. For example, the forced flow may come from an air nozzle on a hose, or any type of air line, placed about one inch from the target surface at an angle.

The result of the above method for finishing a sputter target results in a surface free of mechanical deformation and with a $R_a$ of about 10–30 $\mu$in. The method relieves residual stresses in the target material resulting from manufacturing and stabilizes the target assembly allowing for a consistent product. The burn-in time necessary in the prior art is significantly decreased, if not eliminated. It is believed that a target with the enhanced finish of the present invention will require only 6 wafers or less for burn-in, which is equivalent to 1 kWh or less. There are no known adverse effects of the chemical etching technique of the present invention, and the method may be easily adapted to the manufacturing process. For example, the method may be used for small special order targets, or may be adapted into an automated line for mass production.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details and method and illustrative examples described. Accordingly, departures may be made from such details without departing from the scope or spirit of applicant's general inventive concept.

What is claimed is:

1. A method of enhancing finish of a sputter target surface to achieve a reduced burn-in time during sputtering comprising:

finishing the surface of the sputter target to provide a surface roughness of less than about 25 $\mu$in.;

immersing the sputter target in an etching solution one or more times to form an etched target; and rinsing the etched target in water wherein the etched sputter target has a surface roughness of about 10 to about 30 $\mu$in. to decrease the burn-in time for the etched sputter target in comparison to the burn-in time for the surface of the sputter target after the finishing step.

2. The method of claim 1, wherein the etching solution is comprised of water and an etchant selected from the group consisting of: hydrofluoric acid, nitric acid, phosphoric acid, sulfuric acid, hydrochloric acid, acetic acid, lactic acid, ammonium hydroxide, chromic oxide, hydrogen peroxide, potassium ferricyanide and sodium hydroxide, and mixtures thereof.

3. A method of enhancing finish of a sputter surface of a sputter target to achieve a reduced burn-in time during sputtering, comprising the steps of:

finishing the surface of the sputter target to provide a surface roughness of less than about 25 $\mu$in.;

immersing the sputter surface in a first solution of an etchant and water;

rinsing the sputter surface with water;

immersing the sputter surface in a second solution of an etchant and water to form an etched target;

rinsing the sputter surface with water;

rinsing the sputter surface with a third solution of alcohol and water; and drying the sputter surface wherein the sputter surface has a surface roughness of about 10 to about 30 $\mu$in. to decrease the burn-in time for the etched sputter target in comparison to the surface of the sputter target after the finishing step.

4. The method of claim 3, wherein the first solution and the second solution are comprised of at least one etchant selected from the group consisting of: hydrofluoric acid, nitric acid, phosphoric acid, sulfuric acid, hydrochloric acid, acetic acid, lactic acid, ammonium hydroxide, chromic oxide, hydrogen peroxide, potassium ferricyanide and sodium hydroxide, and mixtures thereof.

5. A method of enhancing finish of a sputter surface of a titanium sputter target comprising the steps of:

finishing the surface of the sputter target to provide a surface roughness of less than about 25 $\mu$in.;

immersing the sputter surface in a first solution of hydrofluoric acid in water;

rinsing the sputter surface with water to remove the hydrofluoric acid;

immersing the sputter surface in a second solution of hydrofluoric acid and nitric acid in water with at least intermittent agitation to form an etched target;

rinsing the sputter surface with water to remove the hydrofluoric acid and the nitric acid;

rinsing the sputter surface with a third solution of alcohol in water; and drying the sputter surface with a force flow of dry gas wherein the sputter surface has a surface roughness of about 10 to about 30 $\mu$in. to decrease the burn-in time for the etched sputter target in comparison to the surface of the sputter target after the finishing step.

* * * * *